United States Patent
Kagami et al.

(10) Patent No.: US 7,115,432 B2
(45) Date of Patent: Oct. 3, 2006

(54) BASE PATTERN FORMING MATERIAL FOR ELECTRODE AND WIRING MATERIAL ABSORPTION, ELECTRODE AND WIRING FORMING METHOD, AND METHOD OF MANUFACTURING IMAGE FORMING APPARATUS

(75) Inventors: Kazuhiro Kagami, Tokyo (JP); Masahiro Terada, Kanagawa (JP); Shosei Mori, Kanagawa (JP); Tsuyoshi Furuse, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/627,645

(22) Filed: Jul. 28, 2003

(65) Prior Publication Data
US 2004/0020689 A1 Feb. 5, 2004

(30) Foreign Application Priority Data
Aug. 5, 2002 (JP) ............................. 2002-227006

(51) Int. Cl.
*H01L 21/00* (2006.01)

(52) U.S. Cl. .................. 438/30; 438/48; 438/149; 430/66; 430/270.1

(58) Field of Classification Search ................ 438/30, 438/48, 149, 164; 430/66, 270.1, 311
See application file for complete search history.

(56) References Cited

U.S. PATENT DOCUMENTS

| | | | | |
|---|---|---|---|---|
| 5,631,753 A | * | 5/1997 | Hamaguchi et al. | 349/110 |
| 5,696,384 A | | 12/1997 | Ogi et al. | 252/182.12 |
| 5,996,488 A | | 12/1999 | Yanagisawa et al. | 101/170 |
| 6,011,567 A | * | 1/2000 | Nakamura et al. | 347/115 |
| 6,137,218 A | | 10/2000 | Kaneko et al. | 313/495 |
| 6,283,813 B1 | | 9/2001 | Kaneko et al. | 445/24 |
| 6,457,408 B1 | | 10/2002 | Yanagisawa et al. | 101/170 |
| 6,586,155 B1 | * | 7/2003 | Furuse et al. | 430/270.1 |
| 2002/0012868 A1 | * | 1/2002 | Furuse et al. | 430/270.1 |
| 2003/0026959 A1 | * | 2/2003 | Furuse et al. | 428/195 |

FOREIGN PATENT DOCUMENTS

| | | |
|---|---|---|
| JP | 5-114504 | 5/1993 |
| JP | 8-176177 | 7/1996 |
| JP | 8-185818 | 7/1996 |
| JP | 8-236017 | 9/1996 |
| JP | 2001-297639 | 10/2001 |
| JP | 2003-31922 | 1/2003 |

* cited by examiner

*Primary Examiner*—Hsien-Ming Lee
(74) *Attorney, Agent, or Firm*—Fitzpatrick, Cella, Harper & Scinto

(57) ABSTRACT

A fine electrode and wiring pattern with a good adhesive property is easily formed using a water-based solution easy to handle and small in environmental load, thereby improving a stability of a manufacturing process of an image-forming apparatus in the case where the water-based solution is used in the manufacturing process. A base pattern is formed using a base pattern forming material for electrode and wiring material absorption which is a water-based solution containing a water-soluble photosensitive resin component and a water-soluble metallic compound including rhodium, bismuth, ruthenium, vanadium, chromium, tin, lead, or silicon. An organic metallic compound is absorbed in the base pattern and then baking is conducted to form electrodes and wirings.

10 Claims, 2 Drawing Sheets

BASE PATTERN FORMING MATERIAL FOR ELECTRODE AND WIRING MATERIAL ABSORPTION, ELECTRODE AND WIRING FORMING METHOD, AND METHOD OF MANUFACTURING IMAGE FORMING APPARATUS

BACKGROUND OF THE INVENTION

1. Field of the Invention

The present invention relates to a base pattern forming material for electrode and wiring material absorption, which is used for forming electrodes and wirings, an electrode and wiring forming method using the base pattern forming material for electrode and wiring material absorption, and a method of manufacturing an image-forming apparatus using the electrode and wiring forming method.

2. Related Background Art

Up to now, with respect to a method of forming electrodes and wirings on a substrate, there have been known (1) a method of applying a paste containing a conductive material onto a substrate using a screen printing method and conducting drying and baking on the substrate to form electrodes and wirings (Japanese Patent Application Laid-Open No. 8-185818), (2) a method using transfer (Japanese Patent Application Laid-Open No. 8-236017), (3) a method of applying a solution containing metal onto the entire substrate, conducting drying and baking on the substrate to form a metallic film, covering a predetermined region with a mask such as a photoresist, and removing a region which is not covered with the mask by etching to form electrodes and wirings, (4) a method of adding a photosensitive material to a metal-containing paste, exposing a desired region thereof, and then conducting development to form electrodes and wirings (Japanese Patent Application Laid-Open Nos. 5-114504 and 8-176177), (5) a method of forming electrodes and wirings using a coating material containing a water-soluble photosensitive resin, a water-soluble organic metallic compound, and a water-based solvent through application, drying, exposure, development, and baking (Japanese Patent Application Laid-Open No. 2001-297639), and the like.

However, it is difficult to apply the above-mentioned method (1) to a fine electrode and wiring pattern. The uniformity and the reproducibility of a film thickness are insufficient even in the case of the above-mentioned method (2). According to the above-mentioned method (3), in particular, in the case where an electrode and wiring pattern is made of noble metal such as platinum, it is necessary to use strong acid at etching. Therefore, because a resist is attacked or an insulating substrate is eroded, it is difficult to form a fine circuit. Because an organic solvent is used in the above-mentioned method (4), explosion-proof equipment is required in application, drying, and baking processes and the handling of agents in use requires caution. In addition to this, because a large amount of chlorine-based organic solvent is used even in development, there is a problem in that an environmental load is large.

On the other hand, with respect to the above-mentioned method (5), there is an advantage that a fine electrode and wiring pattern can be easily formed by a water-based solution using a water-based solvent, which is easy to handle and small in environmental load. However, because a water-soluble organic metallic compound on an unexposed region is disposed of in the development process, there is a problem in that a cost becomes higher.

Therefore, according to the present applicant, it has been provided already a method of absorbing a water-based solution of an organic metallic compound in a resin pattern made of a water-soluble photosensitive resin and then baking the resin pattern in which the water-based solution of the organic metallic compound is absorbed to form electrodes and wirings in Japanese Patent Application Laid-Open No. 2003-031922.

Now, according to the above-mentioned method, a fine electrode and wiring pattern can be easily formed at low cost without applying a large environmental load. However, there is the case where an adhesive property with a substrate is insufficient. Accordingly, in the case where the above-mentioned method is used for forming electrodes and wirings in an image-forming apparatus, peeling of the electrode and wiring pattern is sometimes caused when ultrasonic cleaning is conducted in a manufacturing step. Thus, there is the case where a manufacturing process becomes unstable.

SUMMARY OF THE INVENTION

The present invention has been made in view of such problems. Therefore, an object of the present invention is to easily form a fine electrode and wiring pattern with a good adhesive property using a water-based solution easy to handle and small in environmental load, thereby improving a stability of a manufacturing process of an image-forming apparatus in the case where the water-based solution is used in the manufacturing process.

In order to attain the above-mentioned object, according to a first aspect of the present invention, there is provided a base pattern forming material for electrode and wiring material absorption including a water-based solution containing a water-soluble photosensitive resin component and a water-soluble metallic compound.

Further, according to a second aspect of the present invention, there is provided an electrode and wiring forming method, including:

a base pattern forming step of forming a base pattern on a substrate;

an absorbing step of absorbing an organic metallic compound in the base pattern; and a baking step of baking the base pattern in which the organic metallic compound is absorbed, in which the base pattern forming step includes:

a step of applying a water-soluble photosensitive resin containing a photosensitive resin component and a water-soluble metallic compound onto the substrate; and a step of exposing the photosensitive resin.

Furthermore, according to a third aspect of the present invention, there is provided a method of manufacturing an image-forming apparatus including a plurality of electron-emitting devices and an image-forming member for forming an image by irradiation of electron beams emitted from the electron-emitting devices, including forming at least one of an electrode and a wiring by the method according to the second aspect of the present invention.

DESCRIPTION OF THE PREFERRED EMBODIMENTS

Figure 1:
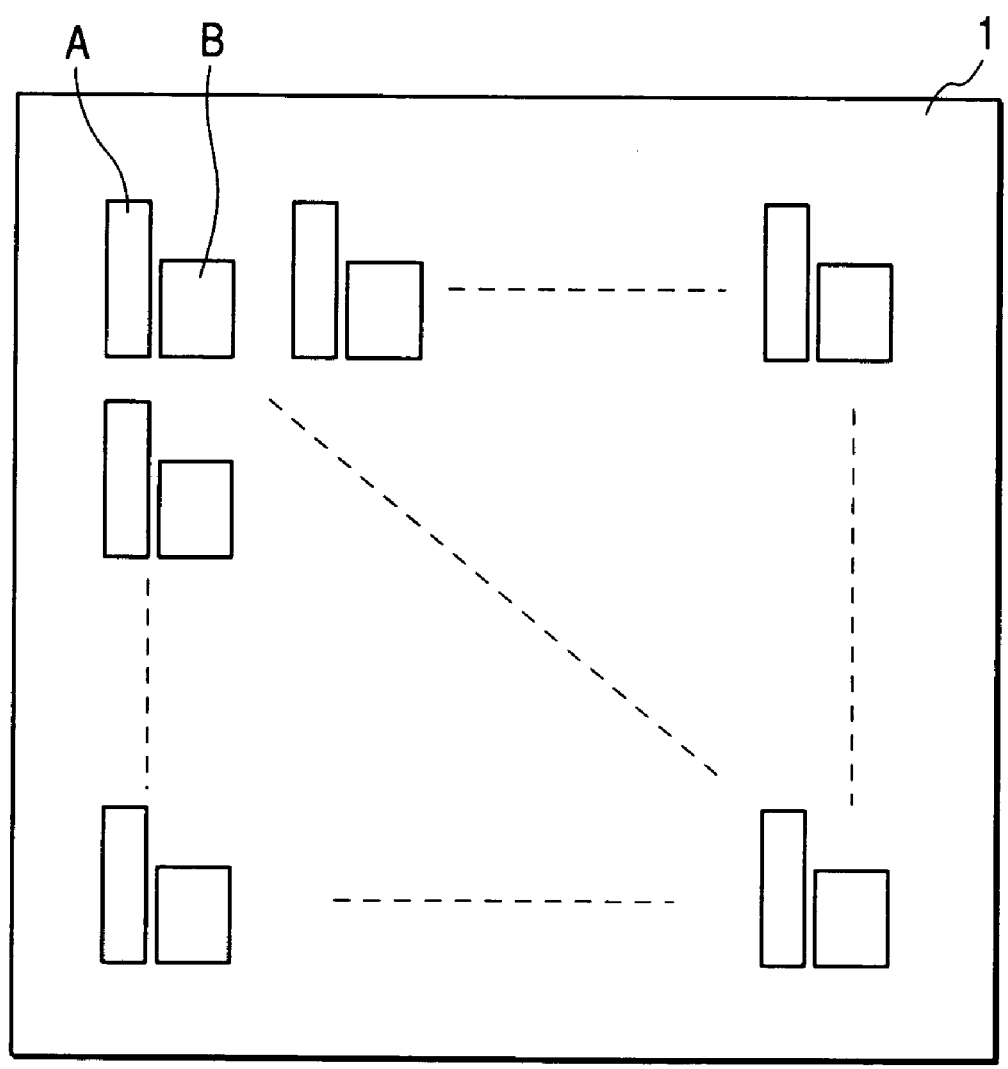
FIG. 1 is a schematic view of an electrode pattern formed according to Embodiment 2 of the present invention.

Hereinafter, a base pattern forming material for electrode and wiring material absorption according to a first aspect of the present invention, an electrode and wiring forming method according to a second aspect of the present invention, and a method of manufacturing an image-forming apparatus according to a third aspect of the present invention will be further described in order.

(1) Base Pattern Forming Material for Electrode and Wiring Material Absorption

A base pattern forming material for electrode and wiring material absorption (hereinafter referred to as "a base material") according to the first aspect of the present invention is a water-based solution which contains a water-soluble photosensitive resin component and a water-soluble metallic compound including rhodium, bismuth, ruthenium, vanadium, chromium, tin, lead, or silicon.

The water-soluble photosensitive resin component can be widely used. However, it is preferable to select a photosensitive resin component which is hard to involve precipitation and gelling by reaction with an added water-soluble metallic compound.

The photosensitive resin component may be of a type in which a photosensitive group is included in a resin structure or a type such as a cyclorubber-bisazide based photoresist, in which a resin is mixed with a photosensitive agent. In either of types of photosensitive resin components, a photo reaction initiator or a photo reaction inhibitor can be mixed as appropriate.

As the photosensitive resin component used in the present invention, for example, a polyvinyl alcohol-based resin or a polyvinyl pyrolidone-based resin is preferable because good water-solubility is easy to obtain. In addition, the photosensitive resin component may be of a type in which it is dissolved in a water-based solvent described later, application and drying are conducted, and then a coating film soluble in a developer is insolubilized in the developer by light irradiation (negative type) or a type in which the coating film insoluble in the developer is solubilized in the developer by light irradiation (positive type).

The water-soluble metallic compound included together with the above-mentioned water-soluble photosensitive resin component includes rhodium, bismuth, ruthenium, vanadium, chromium, tin, lead, or silicon, as a metallic component, and serves to improve an adhesive property between an electrode and wiring pattern formed by baking described later and a substrate. As the metallic compound, a water-soluble metallic salt, a water-soluble organic metallic compound, or a water-soluble complex, which includes rhodium, bismuth, ruthenium, vanadium, chromium, tin, lead, or silicon can be used.

It is preferable that a compounding ratio of the above-mentioned metallic compound to the above-mentioned photosensitive resin component is 1.0% by weight or more and 20% or less by weight or less. If the compounding ratio of the metallic compound is too large, an electrode and wiring base for a fine pattern is hard to obtain. On the other hand, if the compounding ratio is too small, an adhesive property of an obtained electrode and wiring pattern is hard to sufficiently improve.

A base material according to the first aspect of the present invention is a water-based solution using a water-based solvent. Here, the water-based solvent indicates a solvent containing water of 50% by weight or more. There can be used a water-based solvent obtained by adding lower alcohol such as methyl alcohol or ethyl alcohol thereto in an amount less than 50% by weight in order to increase, for example, a dry speed. Alternatively, there can be used a water-based solvent obtained by adding thereto a component for achieving the promotion of dissolution, the improvement of stability, and the like with respect to the photosensitive resin component and the metallic compound which are described above. However, in view of reduction in environmental load, it is preferable that a content of water is 70% by weight or more. It is more preferable that the content of water is 90% by weight or more. It is most preferable that the water-based solvent is all water.

It is preferable that the base material according to the first aspect of the present invention is a material in which a base pattern formed by a base pattern forming step described later can absorb a water-based solution of an organic metallic compound described later, in particular, a material which reacts with a metallic component in the water-based solution of the organic metallic compound and contains a photosensitive resin component capable of forming an ion-exchangeable base pattern. When the ion-exchangeable base pattern is formed, an absorbing step described later can be conducted as an ion-exchangeable absorbing step. Therefore, the absorption of the metallic component in the organic metallic compound component can be improved, the usage efficiency of materials can be increased, and further a more uniformly shaped electrode and wiring pattern can be formed. In view of control of a pattern shape, an ion-exchangeable photosensitive resin component including a carboxylic acid group is particularly preferable.

(2) Electrode and Wiring Forming Method

An electrode and wiring forming method according to the second aspect of the present invention can be conducted through a base pattern forming step (application step, drying step, exposure step, and development step), an absorbing step, a cleaning step which is conducted if necessary, and a baking step, as described below.

(2-1) Application Step

The application step is a step of applying the above-mentioned base material onto an insulating substrate on which electrodes and/or wirings are to be formed.

The base material can be applied by using one of various printing methods (screen printing, offset printing, flexographic printing, or the like), a spinner method, a dipping method, a spray method, a stamp method, a rolling method, a slit coater method, an ink jet method, or the like.

(2-2) Drying Step

The drying step is a step of volatilizing a water-based solvent contained in the base material applied onto the substrate in the above-mentioned application step to dry a coating film. The coating film can be dried at a room temperature. In order to shorten a drying time, it is preferable that drying is conducted with a heating state. Heat drying can be conducted by using, for example, a no-wind oven, a dryer, or a hot plate. In general, the drying step can be conducted by keeping the substrate at a temperature of 50° C. to 100° C. for 1 minute to 30 minutes.

(2-3) Exposure Step

The exposure step is a step of exposing the coating film on the substrate dried in the above-mentioned drying step along a predetermined electrode and/or wiring pattern.

An area exposed by light irradiation in the exposure step is changed according to whether a photosensitive resin to be used is a negative type or a positive type. In the case of the negative type in which the coating film is insolubilized in a developer by light irradiation, a region in which an electrode and/or a wiring (one of the electrode and the wiring or both)

are to be formed is irradiated with light for exposure. In the case of the positive type in which the coating film is solubilized in the developer by light irradiation, in contrast to the negative type, a region except the region in which the electrode and/or the wiring are to be formed is irradiated with light for exposure. The selection between an irradiation region and a non-irradiation region can be conducted as in a general method of forming a mask using a photoresist.

(2-4) Development Step

The development step is a step of removing a coating film which is exposed in the above-mentioned exposure step and located in a region except a region in which a desired electrode and/or a desired wiring are to be formed, thereby forming a base pattern along an electrode and/or wiring pattern.

In the case where the photosensitive resin is the negative type, the coating film which is not irradiated with light is solubilized in the developer and the coating film in an exposure region which is irradiated with light is insolubilized in the developer. Therefore, the development can be made by dissolving the coating film in a non-irradiation region which is not insolubilized in the developer using the developer for removal. In addition, in the case where the photosensitive resin is the positive type, the coating film which is not irradiated with light is insolubilized in the developer and the coating film in the exposure region which is irradiated with light is solubilized in the developer. Therefore, the development can be made by dissolving the coating film in an irradiation region which is solubilized in the developer using the developer for removal.

Note that a developer similar to the above-mentioned water-based solvent can be used.

(2-5) Absorbing Step

The absorbing step is a step of absorbing an organic metallic compound in the base pattern formed through the above-mentioned respective steps.

The absorption of the organic metallic compound can be conducted by contacting a water-based solution of the organic metallic compound with the above-mentioned base patter to absorb the water-based solution in the base pattern. If the aqueous solution of the organic metallic compound can be brought into contact with the base pattern to absorb the aqueous solution of the organic metallic compound, any method such as a dipping method or a spin coating method can be used for the absorption.

An organic metallic compound which has water-solubility to the same water-based solution as described above and from which a metallic film can be made in a baking step described later is used. More specifically, complexes of, for example, gold, platinum, silver, palladium, and copper can be listed. Of those, in particular, a complex of platinum is preferably used because the electrode and/or the wiring which are chemically extremely stable are easy to obtain. With respect to the complex, it is preferable that its ligand is a nitrogen-containing compound. In particular, a complex, for example, alcohol amine such as ethanolamine, propanolamine, isopropanolamine, or butanolamine, serinol, or TRIS, in which the ligand is composed of any one of nitrogen-containing compounds having 8 or less carbon atoms or plural kinds thereof is more preferable.

The degree of absorption of the organic metallic compound depends on a contact time with the water-based solution, a concentration of the organic metallic compound in the water-based solution, the absorption capacity of the base pattern, and the like. However, they can be selected as appropriate. In addition, it is possible that the base pattern is immersed in water or the like before the contact with the water-based solution of the organic metallic compound, thereby making the water-based solution of the organic metallic compound easy to absorb.

(2-6) Cleaning Step

The cleaning step is a step of removing an excess water-based solution deposited on the base pattern and an excess water-based solution deposited on a region except for the base pattern after the water-based solution of the organic metallic compound is absorbed in the base pattern.

The cleaning step can be conducted by a method in which a cleaning liquid similar to the water-based solvent in the water-based solution of the organic metallic compound is used and a base on which the base pattern is formed is immersed in the cleaning liquid, a method of spraying the cleaning liquid on the base on which the base pattern is formed, or the like. In addition, the cleaning step can be conducted by sufficiently shaking off the excess water-based solution by, for example, air spraying or vibration.

(2-7) Baking Step

The baking step is a step of baking the base pattern (coating film in the irradiation region in the case of the negative type and coating film in the non-irradiation region in the case of the positive type) through the above-mentioned absorbing step to decompose and remove an organic component in the base pattern, thereby forming a metallic film containing an organic metallic compound component.

The baking can be conducted in the air in the case where the metallic film to be formed is a film made of noble metal. In the case where the metallic film is a metallic film such as a copper film or a palladium film, which is easy to oxidize, the baking can be also conducted in a vacuum or a deoxidation atmosphere (for example, an atmosphere containing inert gases such as nitrogen).

Although a baking condition is changed according to, for example, a type of the organic component contained in the base pattern, baking can be conducted by generally keeping the substrate at a temperature of 400° C. to 600° C. for several minutes to several tens of minutes. The baking can be conducted by, for example, a hot air circulating oven. According to the baking, the metallic film can be formed on the substrate along the predetermined electrode and/or wiring pattern.

(3) Method of Manufacturing an Image-forming Apparatus

The above-mentioned electrode and wiring forming method of the present invention can be suitably used for a method of manufacturing an image-forming apparatus provided with a plurality of electron-emitting devices and an image-forming member for forming an image by irradiation of electron beams emitted from the electron-emitting devices. In other words, by forming one of an electrode and a wiring or both of them in the image-forming apparatus using the electrode and wiring forming method of the present invention, a manufacturing process thereof can be largely simplified.

It is preferable that the electron-emitting device used in the image-forming apparatus as a manufacturing object is a cold cathode device such as a surface conduction electron-emitting device, a field emission (FE) electron-emitting device, or a metal-insulating layer-metal (MIM) electron-emitting device. Of those, the surface conduction electron-emitting device in which device electrodes are easy to simultaneously form by the electrode and wiring forming method of the present invention is preferable. In addition, according to the electrode and wiring forming method of the present invention, wirings necessary to drive the respective electron-emitting devices can be formed simultaneously with the device electrodes.

The image-forming apparatus of the present invention includes a television receiver, a computer display, a printer, and a copying machine. In the cases of, for example, the television receiver and the computer display, a phosphor that emits light by the irradiation of electron beams can be used as the image-forming member. In the cases of, for example, the printer and the copying machine, a latent image-forming member that forms a latent image by the irradiation of electron beams can be used as the image-forming member.

Hereinafter, the present invention will be described in more detail through embodiments. The present invention is not limited to the embodiments.

Embodiment 1

An aqueous solution of a metallic compound (lead acetate) (lead content is 1% by weight) and an aqueous solution of a photosensitive resin component (polyvinyl alcohol containing 4,4'-diazidestilbene-2,2'-sodium disulfonate as a photosensitive agent) are mixed with each other at the following ratio to prepare a base material 1-A.

Metallic compound: 10 parts by weight
Photosensitive resin component: 90 parts by weight (containing photosensitive agent of 10 parts by weight)

The base material 1-A is applied onto the entire surface of a substrate made of glass (75 mm×75 mm×2.8 mm in thickness) by a spin coater and dried at 80° C. for 2 minutes by a hot plate. A thickness of a coating film obtained after drying is 1.34 µm.

Next, a negative photo mask is used and the above mentioned coating film is exposed for an exposure time of 30 seconds while keeping a gap of 30 µm by an ultra-high pressure mercury lamp (illumination=8.0 mW/cm$^2$) as a light source. After the exposure, pure water is used as a developer and processing is conducted for 30 seconds by dipping to obtain a base pattern patterned in a target pattern.

The substrate on which the base pattern is formed is immersed in pure water for 30 seconds and then immersed in an aqueous solution of a platinum acetate monoethanolamine complex (platinum content is 1% by weight) for 60 seconds. At this time, the aqueous solution is agitated such that an agitation speed on the base pattern becomes 0.1 m/second by a stirrer.

After that, the substrate is lifted off, washed with running water for 5 seconds, drained by air, and dried for 3 minutes by a hot plate with 80° C.

After that, baking is conducted at 500° C. for 30 minutes by a hot air circulating oven, thereby forming platinum electrodes in which a distance therebetween is 20 µm, a width thereof is 60 µm, a length thereof is 120 µm, and a thickness thereof is 20 nm.

A sheet resistance value of the electrodes is 200Ω/square.

Further, a tape peeling test is conducted to measure the adhesive property. As a result, peeling of the electrode pattern is not found and it is preferable.

After that, an image-forming apparatus is manufactured using the electrode pattern forming method. Even when an ultrasonic wave is applied in the cleaning step, peeling of the electrode pattern is not found.

Comparative Example 1

A solution in which an amine-based silane coupling agent ("KBM-603" produced by Shin-Etsu Chemical Co., Ltd.) is added at 0.06% by weight to a photosensitive resin ("San-resiner-BMR-850" produced by Sanyo Chemical Industries, Ltd.) is applied onto the entire surface of a substrate made of glass (75 mm×75 mm×2.8 mm in thickness) by a spin coater and dried at 45° C. for 2 minutes by a hot plate.

Next, a negative photo mask is used, the substrate and the mask are brought into contact with each other, and the substrate is exposed for an exposure time of 2 seconds by an ultra-high pressure mercury lamp (illumination=8.0 mW/cm$^2$) as a light source. After the exposure, pure water is used as a developer and processing is conducted for 30 seconds by dipping to obtain a target resin pattern. A thickness of the resin pattern is 1.55 µm.

The substrate on which the resin pattern is formed is immersed in pure water for 30 seconds and then immersed in a solution of a platinum acetate monoethanolamine complex (platinum content is 1% by weight) for 60 seconds.

After that, the substrate is lifted off, washed with running water for 5 seconds, drained by air, and dried for 3 minutes by a hot plate at 80° C.

After that, baking is conducted at 500° C. for 30 minutes by a hot air circulating oven, thereby forming platinum electrodes in which a distance therebetween is 20 µm, a width thereof is 60 µm, a length thereof is 120 µm, and a thickness thereof is 20 nm.

A sheet resistance value of the electrodes is 45Ω/square.

Further, a tape peeling test is conducted to measure the adhesive property. As a result, peeling of the electrode pattern is found in a portion of the substrate because the adhesive property of the electrode pattern is unstable.

After that, an image-forming apparatus is manufactured using the electrode pattern forming method. When an ultrasonic wave is applied in the cleaning step, peeling of a portion of the electrode pattern is found.

Embodiment 2

An image-forming apparatus will be manufactured using the electrode and wiring pattern forming method of the present invention. Hereinafter, a manufacturing order will be described with reference to FIGS. 1 and 2.

Step 1: A large number of device electrode pairs are formed on a substrate 1 made of glass (300 mm×300 mm×2.8 mm in thickness) by the same method as in Embodiment 1.

Each of the device electrode pairs in this embodiment is composed of a device electrode "A" having a width of 60 µm and a length of 480 µm and a device electrode "B" having a width of 120 µm and a length of 200 µm, which are opposed to each other at an interelectrode gap of 20 µm. In addition, pitches of the device electrode pairs are set to 300 µm in the lateral direction and 650 µm in the longitudinal direction. The number of device electrode pairs is 720×240 and they are arranged in matrix. A sheet resistance value of a platinum film pattern with 1 cm×1 cm, which is formed simultaneously with the device electrode pairs is 26Ω/square.

Step 2: An X-directional wiring 2 connected with device electrodes "A" of the device electrode pairs is provided for each column by a screen printing method. Next, an interlayer insulating layer having a thickness of 20 µm (which is omitted in the drawing) is provided by a screen printing method, and a Y-directional wiring 3 connected with device electrodes "B" of the device electrode pairs is provided thereon for each row as in the case of the X-directional wiring 2. Then, baking is conducted to form the X-directional wirings 2 and the Y-directional wirings 3.

Step 3: The substrate 1 on which the X-directional wirings 2 and the Y-directional wirings 3 are formed in Step 2 is washed with pure water.

Step 4: In order that a concentration of palladium becomes about 0.15% by weight, a palladium acetate-monoethanolamine complex is dissolved in an aqueous solution in which polyvinyl alcohol with a concentration of 0.05% by weight, 2-propanol with a concentration of 15% by weight, and ethylene glycol with a concentration of 1% by weight have been dissolved, thereby obtaining a light yellow aqueous solution.

A drop of the above-mentioned aqueous solution is put 4 times onto the same region (dot size=about 100 μm) by an ink jet method such that the drop is provided from the upper portions of the device electrodes A and B composing each of the device electrode pairs to an electrode gap between the device electrodes A and B.

The substrate 1 on which the drop of the above-mentioned aqueous solution is provided is baked at 350° C. for 30 minutes by a baking furnace, thereby forming between each of the device electrode pairs a palladium thin film 4 that connects between the device electrodes A and B composing the corresponding device electrode pair. After that, the substrate 1 is fixed onto a rear plate 5.

Step 5: A face plate 10 in which a fluorescent film 8 and a metal back 9 are formed on the inside surface of a substrate 7 made of glass is opposed to the above-mentioned rear plate and they are seal-bonded through a support frame 6 to construct an envelope 11. The support frame 6 is connected in advance with a supply and exhaust tube used for ventilation and exhaust.

Step 6: The envelope 11 is exhausted up to $1.3 \times 10^{-5}$ Pa through the supply and exhaust tube. After that, forming that produces a fissure portion of several tens μm in the palladium thin film 4 located between the device electrodes A and B is conducted for each line. In other words, a voltage is applied to the device electrode pairs in each column using X-directional terminals Dx1 to Dxn connected with the respective X-directional wirings 2 and Y-directional terminals Dy1 to Dyn connected with the respective Y-directional wirings 3, thereby forming surface conduction electron-emitting devices.

Step 7: After the envelope 11 is exhausted up to $1.3 \times 10^{-5}$ Pa, benzonitrile is introduced into the envelope 11 through the supply and exhaust tube until an inner pressure thereof becomes $1.3 \times 10^{-2}$ Pa. Then, a pulse voltage is applied to each of the device electrode pairs as in the above-mentioned forming, thereby conducting activation that deposits carbon in the fissure portion of the above-mentioned palladium thin film 4. The pulse voltage is applied to each line for 25 minutes.

Step 8: The envelope 11 is sufficiently exhausted through the supply and exhaust tube, and then further exhausted while the entire envelope 11 is heated at 250° C. for 3 hours. Finally, a getter is flashed and the supply and exhaust tube is sealed.

Figure 2:
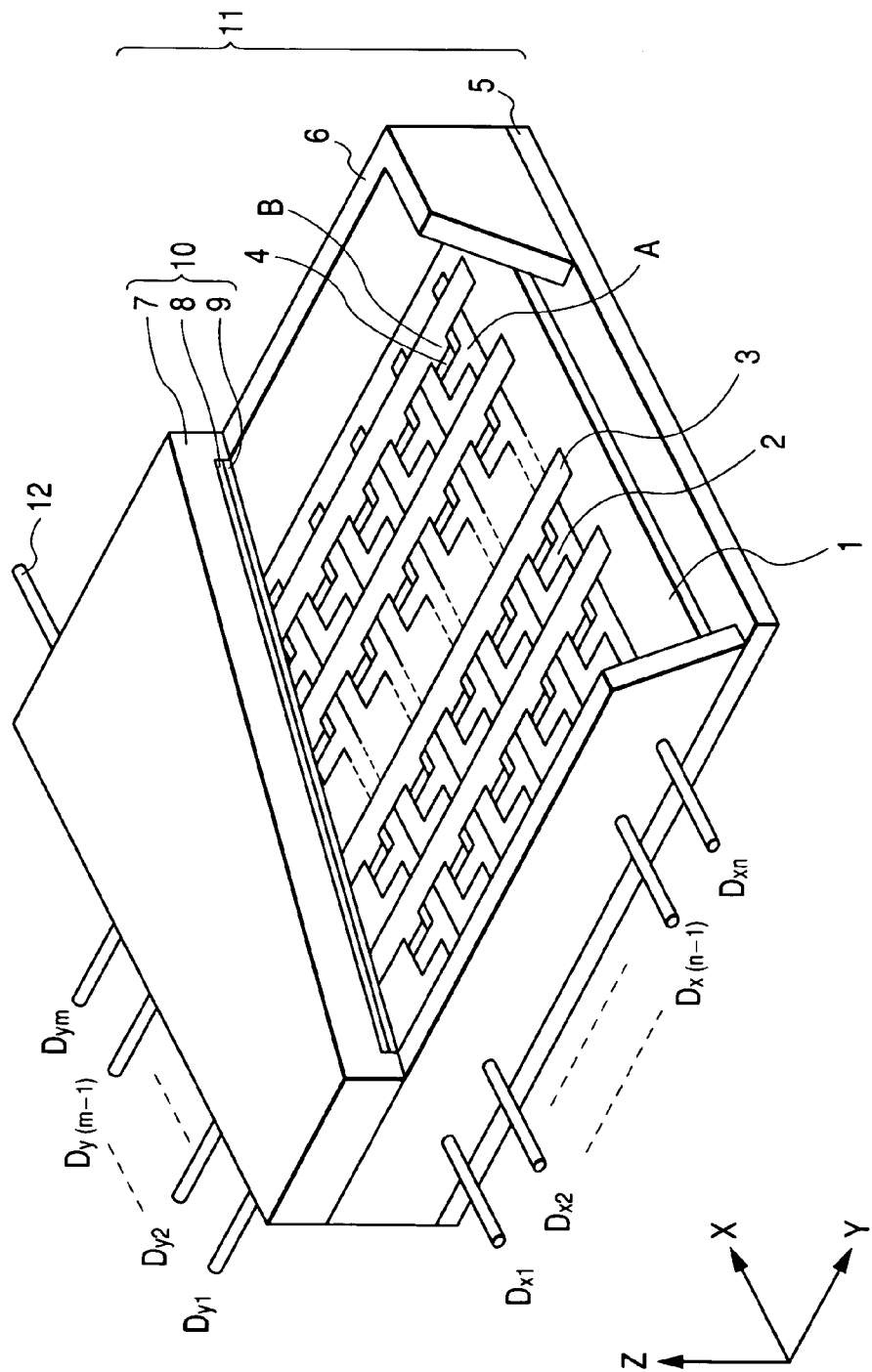
FIG. 2 is a schematic view showing a display panel section of an image-forming apparatus manufactured according to Embodiment 2 of the present invention.

A display panel as shown in FIG. 2 is produced by the above processing and connected with a driver circuit composed of a scanning circuit, a control circuit, a modulation circuit, a direct current voltage source, and the like, which is not shown, thereby manufacturing a panel shaped image-forming apparatus.

A predetermined voltage is applied in time division to each of the surface conduction electron-emitting devices through the X-directional terminals Dx1 to Dxn and the Y-directional terminals Dy1 to Dyn. In addition, a high voltage is applied to the metal back 9 through a high voltage terminal 12. Therefore, an arbitrary matrix image pattern can be displayed with a preferable image quality.

The present invention is as described above and the following effects can be obtained.

(1) The improvement of film quality of the electrode pattern and the further improvement of adhesive property thereof are possible to thereby prevent a defect such as film peeling, and electrodes and wirings can be formed at low cost.

(2) Because the organic metallic compound (preferably, a metallic complex with a specific ligand) can be selectively absorbed in the target pattern portion, the use efficiency of materials can be greatly improved.

(3) Because the use efficiency can be improved, electrodes and wirings can be formed at low cost.

What is claimed is:

1. An electrode and wiring forming method, comprising:
a step of applying on a substrate a photosensitive resin containing a water-soluble photosensitive resin component and a water-soluble metallic compound;
a step of exposing the applied photosensitive resin;
a step of developing the exposed photosensitive resin to form on the substrate a base pattern containing at least the water-soluble metallic compound;
an absorbing step of absorbing an organic metallic compound containing a metal different from that in the water-soluble metallic compound into the base pattern; and
a baking step of baking the base pattern in which the organic metallic compound is absorbed at a temperature from 400° C. to 600° C.

2. An electrode and wiring forming method according to claim 1, wherein a compounding ratio of the water-soluble metallic compound to the photosensitive resin component is 1.0% by weight to 20% by weight.

3. An electrode and wiring forming method according to claim 2, wherein the water-soluble metallic compound is a water-soluble metallic compound including rhodium, bismuth, ruthenium, vanadium, chromium, tin, lead, or silicon.

4. A method of manufacturing an image-forming apparatus including a plurality of electron-emitting devices and an image-forming member for forming an image by irradiation of electron beams emitted from the electron-emitting devices, comprising:
forming said plurality of electron-emitting devices and said image-forming member,
wherein at least one of an electrode and a wiring is formed by the method comprising:
a step of applying on a substrate a photosensitive resin containing a water-soluble photosensitive resin component and a water-soluble metallic compound;
a step of exposing the applied photosensitive resin;
a step of developing the exposed photosensitive resin to form on the substrate a base pattern containing at least the water-soluble metallic compound;
an absorbing step of absorbing an organic metallic compound containing a metal different from that in the water-soluble metallic compound into the base pattern; and
a baking step of baking the base pattern in which the organic metallic compound is absorbed at a temperature from 400° C. to 600° C.

5. The method according to claim 4, wherein a compounding ratio of the water-soluble metallic compound to the photosensitive resin component is 1.0% by weight to 20% by weight.

6. The method according to claim 5, wherein the water-soluble metallic compound is a water-soluble metallic compound including rhodium, bismuth, ruthenium, vanadium, chromium, tin, lead, or silicon.

7. An electroconductive member forming method, comprising:
- a step of forming on a substrate a precursor pattern of the electroconductive member containing at least a metallic compound;
- a step of absorbing an organic metallic compound containing a metal different from that in the metallic compound into the precursor pattern; and
- a step of baking the precursor pattern that absorbed the organic metallic compound.

8. The method according to claim 7, wherein the metallic compound includes rhodium, bismuth, ruthenium, vanadium, chromium, tin, lead, or silicon.

9. An electrode and wiring forming method, comprising:
- a step of forming on a substrate a precursor pattern of the electrode and wiring containing at least a metallic compound;
- a step of absorbing an organic metallic compound containing a metal different from that in the metallic compound into the precursor pattern; and
- a step of baking the precursor pattern that absorbed the organic metallic compound to form the electrode and wiring.

10. The method according to claim 9, wherein the metallic compound includes rhodium, bismuth, ruthenium, vanadium, chromium, tin, lead, or silicon.

* * * * *